(12) United States Patent
Wang et al.

(10) Patent No.: US 10,381,339 B1
(45) Date of Patent: Aug. 13, 2019

(54) INTEGRATED CIRCUITS WITH MEMORY CELL TEST CIRCUITS AND METHODS FOR PRODUCING THE SAME

(71) Applicant: Globalfoundries Singapore Pte. Ltd., Singapore (SG)

(72) Inventors: Chenchen Jacob Wang, Singapore (SG); Teck Leong Wee, Singapore (SG); Dimitri Houssameddine, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/927,422

(22) Filed: Mar. 21, 2018

(51) Int. Cl.
*H01L 23/58* (2006.01)
*H01L 27/02* (2006.01)
*G11C 5/02* (2006.01)
*H01L 21/66* (2006.01)
*H01L 27/22* (2006.01)

(52) U.S. Cl.
CPC .......... *H01L 27/0207* (2013.01); *G11C 5/025* (2013.01); *H01L 22/14* (2013.01); *H01L 22/32* (2013.01); *H01L 27/222* (2013.01)

(58) Field of Classification Search
CPC ......... H01L 22/14; H01L 22/30; H01L 22/34; G01R 31/26; G01R 31/265; G01R 31/28; G01R 31/2801; G01R 31/281; G01R 31/2818; G01R 31/2831; G01R 31/2836; G01R 31/2856; G01R 31/2879; G01R 31/3008; G01R 31/303; G01R 31/304; H02P 29/024; H02H 3/023
See application file for complete search history.

(56) References Cited

U.S. PATENT DOCUMENTS

| | | | | |
|---|---|---|---|---|
| 9,768,188 B2 * | 9/2017 | Hishida | ........... | H01L 21/823437 |
| 2011/0063889 A1 * | 3/2011 | Fukano | ................. | G11C 5/025 |
| | | | | 365/148 |
| 2018/0138151 A1 * | 5/2018 | Shih | ...................... | H01L 23/562 |

* cited by examiner

*Primary Examiner* — Hsien Ming Lee
(74) *Attorney, Agent, or Firm* — Lorenz & Kopf, LLP

(57) ABSTRACT

Integrated circuits and methods of producing the same are provided. In an exemplary embodiment, an integrated circuit includes a first and second dummy memory cell positioned within a dummy memory bank area. A first dummy top electrode overlies the first and second dummy memory cells, and is in electrical communication with the first and second dummy memory cells. A test circuit is in electrical communication with the first dummy top electrode.

18 Claims, 5 Drawing Sheets

INTEGRATED CIRCUITS WITH MEMORY CELL TEST CIRCUITS AND METHODS FOR PRODUCING THE SAME

TECHNICAL FIELD

The technical field generally relates to integrated circuits with memory cell test circuits and methods of producing the same, and more particularly relates to integrated circuits with memory cells for test circuits that closely mimic active memory cells within the integrated circuit, and methods of producing the same.

BACKGROUND

Integrated circuits with memory banks often include thousands or millions of memory cells that save data for operations. The memory cells are typically very small, and may involve tens or hundreds of manufacturing processes. Perfect control of the multiple manufacturing processes at the small scales involved is challenging, and unintended electrical communication (shorts) between memory cells or other manufacturing defects may be present on some devices. The small size and high density of the memory cells and other devices combined with the large number of integrated circuits produced on a daily basis can make detection of shorts or other manufacturing defects difficult.

Process monitoring structures are included in many integrated circuit designs to help detect shorts or other manufacturing errors at the wafer level. These process monitoring structures typically include memory cells on a small scale, where these memory cells mimic the actual memory cell used for memory purposes in the integrated circuit. However, the memory cells that mimic those used for actual memory purposes (sometimes referred to as "dummy" memory cells) are not used for actual data storage within the integrated circuit. These "dummy" memory cells are typically produced in an area remote from the memory cells used for actual memory storage (i.e., "active" memory cells,) such as in a scribe line area. In some embodiments, the active and dummy memory cells may be similar, but the electronic components associated with the dummy memory cells may differ from that utilized for the active memory cells. Shorts or other manufacturing defects that manifest in the memory cells may be associated with faulty memory cells in some embodiments, but these shorts may be associated with other related structures in other embodiments. Such defects may be detected with memory bank circuitry distinct from the actual memory cells in some embodiments.

Accordingly, it is desirable to provide integrated circuits with dummy memory cells and associated circuitry that is similar or identical to active memory cells and associated circuitry, and methods for producing the same. In addition, it is desirable to provide integrated circuits with memory cell test circuits that more accurately model active memory cells within active memory bank areas. Furthermore, other desirable features and characteristics of the present embodiment will become apparent from the subsequent detailed description and the appended claims, taken in conjunction with the accompanying drawings and this background of the invention

BRIEF SUMMARY

Integrated circuits and methods of producing the same are provided. In an exemplary embodiment, an integrated circuit includes a first and second dummy memory cell positioned within a dummy memory bank area. A first dummy top electrode overlies the first and second dummy memory cells, and is in electrical communication with the first and second dummy memory cells. A test circuit is in electrical communication with the first dummy top electrode.

An integrated circuit is provided in another embodiment. The integrated circuit includes a first dummy memory cell and a test circuit. A first dummy top electrode overlies the first dummy memory cell, where the first dummy top electrode is in electrical communication with the first dummy memory cell and with the test circuit. The integrated circuit also includes an active memory cell and an active top electrode overlying the active memory cell. The active top electrode is in electrical communication with the active memory cell, but the active top electrode is electrically isolated from the test circuit.

A method of producing an integrated circuit is provided in yet another embodiment. The method includes forming a first and a second dummy memory cell within a dummy memory bank. A first dummy top electrode is formed in electrical communication with both the first and second dummy memory cells, where the first dummy top electrode overlies both the first and second dummy memory cells. A test circuit is formed in electrical communication with the first dummy top electrode.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and processes described herein may be incorporated into a more comprehensive procedure having additional processes or functionality not described in detail herein. In particular, various processes in the manufacture of integrated circuits are well-known and so, in the interest of brevity, many conventional processes will only be mentioned briefly herein or will be omitted entirely without providing the well-known process details.

An integrated circuit includes a first dummy memory cell and a second dummy memory cell, where a first dummy top electrode is in electrical communication with both the first and second dummy memory cells. The first and second dummy memory cells are interrogated during testing using the first dummy top electrode, where the first dummy top electrode is similar to an active top electrode.

Figure 1:
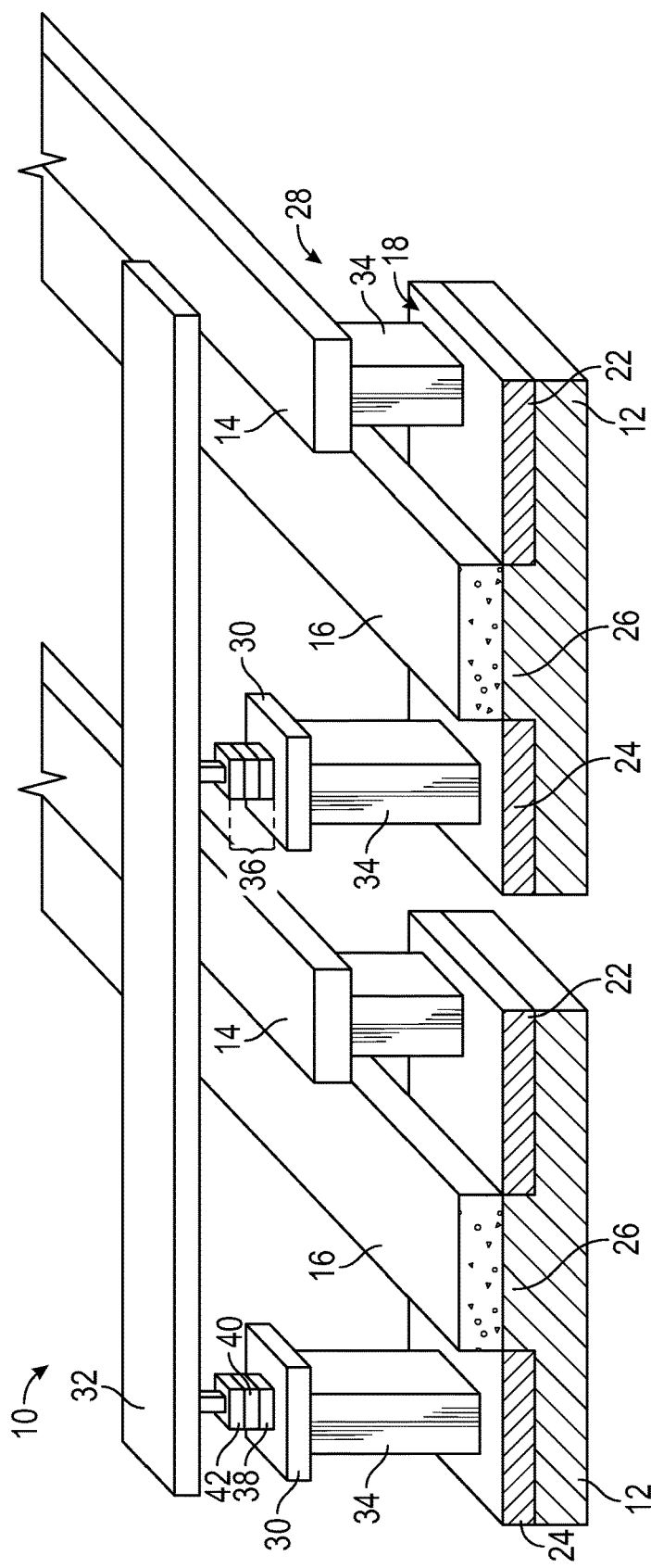
FIG. 1 is a sectional perspective view of an embodiment of an integrated circuit, where certain layers are removed to better illustrate the described components and methods of producing the same.

Referring to an exemplary embodiment illustrated in FIG. 1, an integrated circuit 10 includes a substrate 12 formed of a semiconductor material. FIG. 1 omits some components of the integrated circuit 10, such as interlayer dielectrics, to more clearly illustrate the features of current interest. Furthermore, FIG. 1 depicts one embodiment, and other layouts, orientations, or configurations are also possible. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least about 10 weight percent or more based on the total weight of the referenced component or material, unless otherwise indicated. In many embodiments, the substrate 12 primarily includes a monocrystalline semiconductor material. The substrate 12 may be a bulk silicon wafer (as illustrated) or may be a thin layer of silicon on an insulating layer (commonly known as silicon-on-insulator or SOI, not illustrated) that, in turn, is supported by a carrier wafer.

In an exemplary embodiment, a gate 16 overlies the substrate 12, where a gate insulator (not illustrated) may be positioned between the gate 16 and the substrate 12. As used herein, the term "overlying" means "over" such that an intervening layer may lie between the overlying component (the gate 16 in this example) and the underlying component (the substrate 12 in this example,) or "on" such that the overlying component physically contacts the underlying component. Moreover, the term "overlying" means a vertical line passing through the overlying component also passes through the underlying component, such that at least a portion of the overlying component is directly over at least a portion of the underlying component. It is understood that the integrated circuit 10 may be moved such that the relative "up" and "down" positions change, and the integrated circuit 10 can be operated in any orientation. Spatially relative terms, such as "top", "bottom", "over" and "under" are made in the context of the orientation of the cross-sectional FIG. 1. It is to be understood that spatially relative terms refer to the orientation in the figures, so if the integrated circuit 10 were to be oriented in another manner the spatially relative terms would still refer to the orientation depicted in the figures. Thus, the exemplary terms "over" and "under" remain the same even if the device is twisted, flipped, or otherwise oriented other than as depicted in the figures. The substrate 12 has a substrate surface 18 that is depicted horizontally in FIG. 1, and the substrate surface 18 may be used as a spatial reference herein.

In an exemplary embodiment, the gate 16 includes an electrically conductive material. As used herein, an "electrically insulating material" is a material with a resistivity of about $1\times10^4$ ohm meters or more, an "electrically conductive material" is a material with a resistivity of about $1\times10^{-4}$ ohm meters or less, and an "electrically semiconductive material" is a material with a resistivity of from about more than $1\times10^{-4}$ ohm meters to less than about $1\times10^4$ ohm meters. In one exemplary embodiment, the gate 16 includes polysilicon doped with conductivity determining impurities, but other materials may be used in alternate embodiments.

A source 22 may be formed within the substrate 12 on one side of the gate 16, and a drain 24 may be formed within the substrate 12 on the opposite side of the gate 16. In the illustrated embodiment, the substrate surface 18 is the upper surface of the source 22 and drain 24, but other embodiments are also possible. The source 22 and drain 24 include conductivity determining impurities (sometimes referred to as "dopants") at a higher concentration than in other areas within the substrate 12. A channel 26 is disposed within the substrate 12 between the source 22 and drain 24 and underlying the gate 16. FIG. 1 illustrates a planar transistor 28, where the transistor 28 includes the gate 16, the source 22, the drain 24, and the channel 26. However, finned field effect transistors (not illustrated), transistors with the source and drain formed overlying the substrate (not illustrated), or other types of transistors 28 may be utilized in alternate embodiments.

A memory structure is associated with the transistor 28. In the illustrated embodiment, a bottom electrode 30 is in electrical communication with the drain 24, and a top electrode 32 overlies the bottom electrode 30. The top electrode 32 may function as a "bit line" in some embodiments, but other embodiments are also possible. A contact 34 may be used to electrically connect the drain 24 with the bottom electrodes 30, and another contact (not illustrated) and/or other components may be utilized to form other electrical connections for electrical communication. The term "electrical communication," as used herein, means electrical current is capable of flowing from one component to another, where the electrical current may or may not flow through an electrically conductive or semiconductive intervening component. The term "direct electrical contact," as used herein, means direct physical contact between components that are electrically conductive or semiconductive, but not electrically insulating. A source line 14 may be in electrical communication with the source 22.

A memory cell 36 is positioned between the bottom and top electrodes 30, 32, where the illustrated memory cell 36 is a magnetic tunnel junction (MTJ) memory cell. The memory cell 36 described herein is an MTJ memory cell, but other types of memory cells 36 may also be utilized, where the memory cell 36 is incorporated into the integrated circuit 10 at the back end of the line. Examples of other types of memory cells 36 include, but are not limited to, resistive, phase change, and alternate ferromagnetic memory structures. The MTJ memory cell 36 is in electrical communication with the bottom and top electrodes 30, 32. In the illustrated embodiment, a contact 34 is positioned between the bottom electrode 30 and the memory cell 36, but in alternate embodiments there may be no contacts 34 between the memory cell 36 and either the top and/or bottom electrodes 30, 32, or there may be one, two, or more contacts 34 or other electrically conductive or semi-conductive components between the memory cell 36 and the top and/or bottom electrode 30, 32. In an exemplary embodiment, the gate 16 may serve as a "word line," but other embodiments are also possible. The bottom and top electrodes 30, 32 may include several layers (not illustrated,) such as a seed layer, a core, and a cover, and may include tantalum, tantalum nitride, nickel, copper, aluminum, or other electrically conductive materials. The memory cell 36 and the bottom and top electrodes 30, 32 may also be connected to other electronic components instead of the transistor 28, or in addition to the transistor 28 in various embodiments. The memory cell 36 may be formed by depositing the various layers there within (described more fully below), where the various layers within an MTJ memory cell 36 may be formed by sputtering, ion beam deposition, or other techniques using the appropriate materials. The area where the MTJ memory cell 36 is to be formed may then be lithographically protected, and the exposed portions removed with appropriate etchants to leave the MTJ memory cell 36.

The MTJ memory cell 36 includes several layers, where three general layers are depicted in FIG. 1. The illustrated layers of the MTJ memory cell 36 include sub-layers (not illustrated) in some embodiments, and the MTJ memory cell 36 may include additional layers as well. The illustrated embodiment of the MTJ memory cell 36 includes a fixed layer 38, a tunnel barrier layer 40 overlying the fixed layer 38, and a free layer 42 overlying the tunnel barrier layer 40. In alternate embodiments, the tunnel barrier layer 40 may overlie the free layer 42 and underlie the fixed layer 38, instead of the other way around, but in all embodiments the tunnel barrier layer 40 is between the fixed and free layers 38, 42. The fixed layer 38 and the free layer 42 are magnetic, and the tunnel barrier layer 40 is non-magnetic in an exemplary embodiment. As used herein, a layer or material is "magnetic" if it is a ferromagnetic material, where the term "ferromagnetic" does not require the presence of iron. More particularly, a material is "magnetic" if it is a permanent magnet that retains its magnetic field after an induction magnetic field is removed, where the permanent magnet has a residual flux density of about 0.1 tesla or more. A layer or material is "non-magnetic" if it is a diamagnetic or a paramagnetic material, and more particularly does not form a permanent magnet or is only capable of forming a permanent magnet that has a residual flux density of less than about 0.1 tesla or less. A "permanent" magnet is a magnet that has residual flux density of about 0.1 tesla or more for at least about 1 week or more after being removed from an induction magnetic field.

The fixed layer 38 and the free layer 42 may include one or more of cobalt, platinum, iron, boron, palladium, nickel, gadolinium, or other elements in various embodiments. The different elements may be alloyed, formed as successive layers, or otherwise combined in different embodiments, and the fixed and free layer 38, 42 may include non-magnetic spacer layers (not illustrated) between successive magnetic layers, which are examples of sub-layers. The tunnel barrier layer 40 may include magnesium oxide in an exemplary embodiment, but the tunnel barrier layer 40 may include aluminum oxide or other materials in various embodiments.

Figure 2:
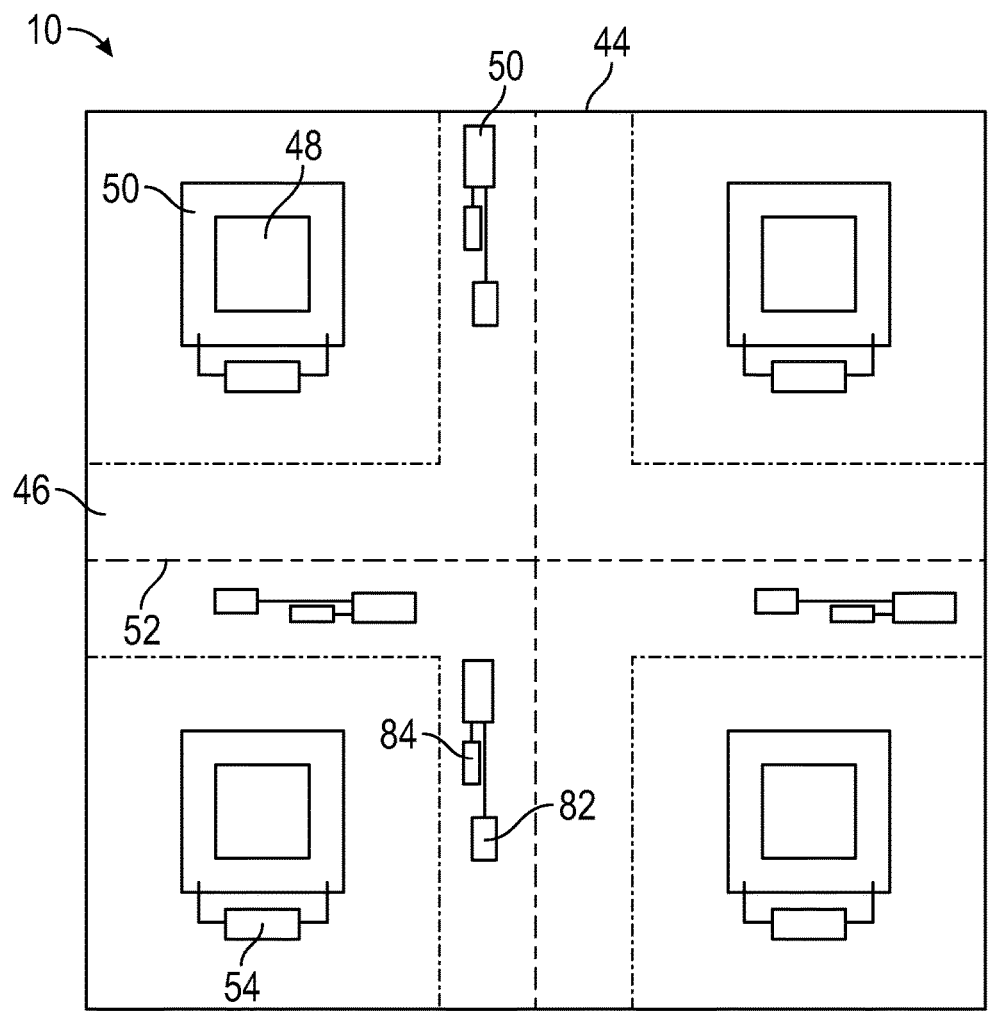
FIGS. 2, 3, and 4 are plan views of embodiments of an integrated circuit, and methods of producing the same.

Reference is made to FIG. 2, with continuing reference to FIG. 1. A plurality of individual integrated circuits 10 may be formed on a wafer 44, where the wafer 44 may be utilized as the substrate 12. The wafer 44 is divided into different areas, where the different areas have different functions for the integrated circuit production process. In the illustrated embodiment, the wafer 44 is divided into a scribe area 46, an active memory bank area 48, a dummy memory bank area 50 adjacent to and surrounding the active memory bank area 48, and another dummy memory bank area 50 positioned within the scribe area 46. The wafer 44 is cut on a scribe line 52 to form a plurality of different integrated circuits 10, where the scribe line 52 is within the scribe area 46. The scribe area 46 is large enough to accommodate variations or wavers of the cut at the scribe line 52. After the different integrated circuits 10 are cut from the scribe area 46, the scribe area 46 is often removed such that the remaining integrated circuits 10 do not include a portion of the scribe area 46, or only include a small portion of the scribe area 46. As such, a dummy memory bank 50 positioned within the scribe area 52 is typically electrically interrogated before the wafer 44 is cut on the scribe lines 52. Several alternate embodiments are possible, such as embodiments with more than one active memory bank area, where a dummy memory bank area 50 may or may not be adjacent to any of the active memory bank areas 48. Embodiments are possible without a dummy memory bank area 50 in the scribe area 46, or with more than one dummy memory bank area 50 in the scribe area 46 for each integrated circuit 10 cut from the wafer. A dummy memory bank area 50 may also be positioned in alternate locations not specifically illustrated in FIG. 2.

The active memory bank area 48 includes memory cells 36 that are actively utilized for memory purposes in the integrated circuit 10, and the dummy memory bank area 50 includes memory cells 36 that are not actively utilized for memory purposes in the integrated circuit 10. The dummy memory bank area 50 may include about 5% of the number of memory cells 36 that are within the active memory bank area 48, but other ratios are also possible. The integrated circuit 10 also includes a test circuit 54 for electrically interrogating the dummy memory bank area 50. The test circuit 54 may include circuitry that the integrated circuit 10 utilizes for electrical interrogation, such as circuitry within a central processing unit or other location, but in an alternate embodiment the test circuit 54 includes a first test pad 82, an optional second test pad 84, and optionally additional test pads (not illustrated.) Different design options are available for a test pad, when present, such as a test pad that is directly contacted by a probe or a test pad that is probed with a scanning electron microscope, or other designs. At least a portion of the memory cells 36 in the dummy memory bank area 50 are in electrical communication with the test circuit 54. In the same manner, the memory cells within the active memory bank area 48 are electrically isolated from the test circuit 54 where the electrical connection may be formed by contacts 34, interconnects, or other electrically conductive structures typically utilized in integrated circuit manufacture. In embodiments where the test circuit 54 is circuitry, the memory cells 36 within the active memory bank area 48 are electrically isolated from the circuitry that is utilized for interrogating the memory cells 36 in the dummy memory bank area 50. In embodiments where the test circuit 54 includes a first and/or second test pad 82, the first and/or second test pads 82 are electrically isolated from the memory cells 36 in the active memory bank area 48. In some embodiments, the test circuit 54 is electrically isolated from all of the memory cells 36 in the active memory bank area 48.

Figure 3:
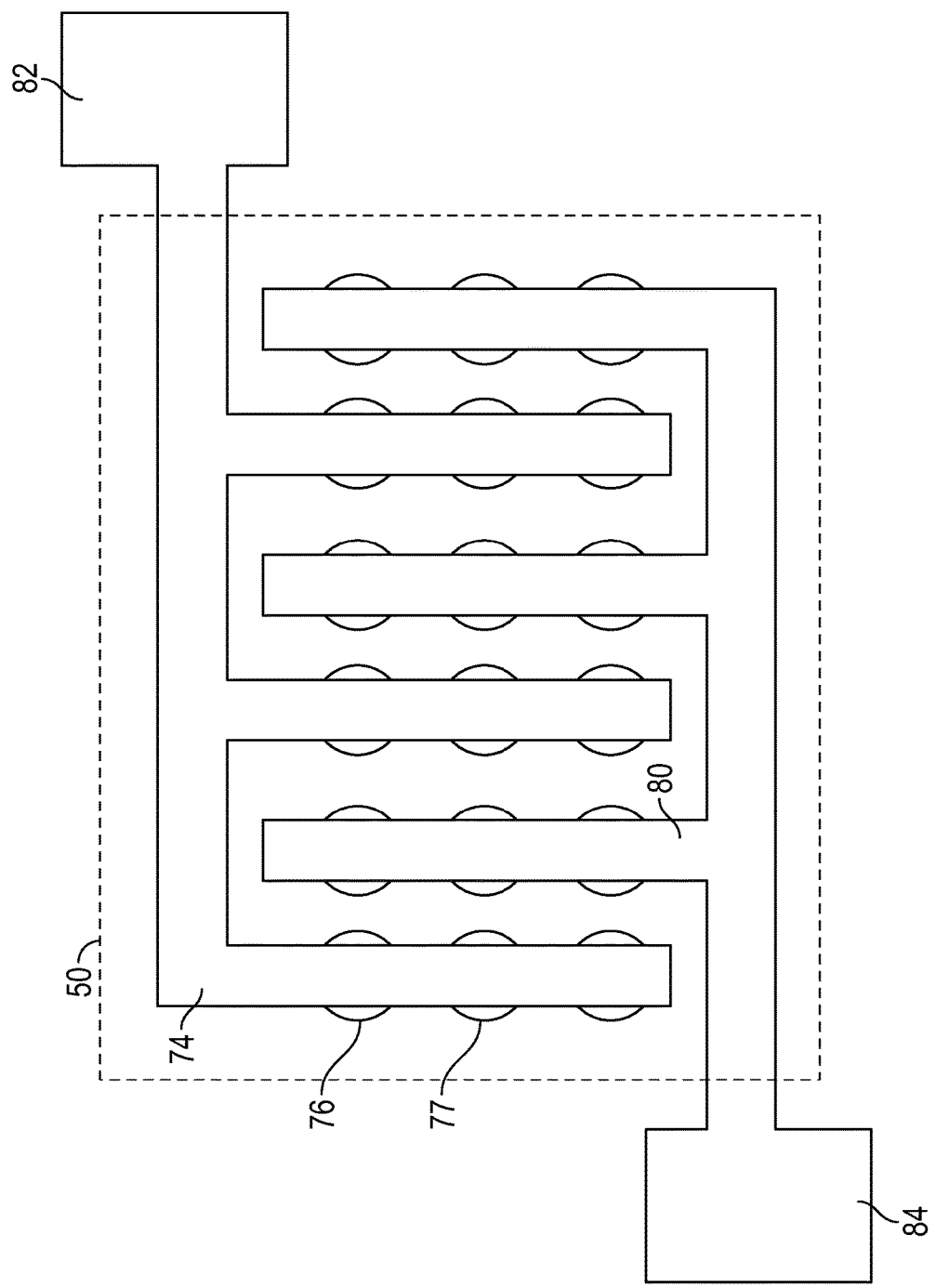

Referring to an exemplary embodiment in FIG. 3, with continuing reference to FIGS. 1 and 2, a dummy memory bank area 50 that is located within the scribe area 46 is illustrated. The transistor 28 illustrated in FIG. 1 is optional for a dummy memory bank area 50 in the scribe area 46, where the transistor 28 may be replaced with one or more metal layers. The dummy memory bank area 50 may be positioned within the scribe area 46 to save space within the integrated circuit 10, but the scribe area 46 is damaged when the wafer 44 is severed so testing is typically performed at the wafer level (before severing within the scribe area 46.) The illustrated dummy memory bank area 50 includes a first dummy top electrode 74 and a second dummy top electrode 80 adjacent to the first dummy top electrode 74. In an exemplary embodiment, the first dummy top electrode 74 is in electrical communication with the first test pad 82, and the second dummy top electrode 80 is in electrical communication with the second test pad 84. The scribe area 46 has few restrictions on space, as opposed to other portions of the integrated circuit, so test pads are typically positioned within the scribe area 46 when test pads are present. As such, the first and/or second test pad 82, 84 may be within the scribe area 46. Alternatively, other types of test circuits 54 may be utilized. The first and second dummy top electrodes 74, 80 are electrically isolated from each other. The first dummy top electrode 74 is also in electrical communication with a first dummy memory cell 76 and a second dummy memory cell 77, as described in more detail below. The first and second test pads 82, 84 can be electrically interrogated, and if any electrical communication is detected it indicates a dummy memory cell short, or a short at the bottom electrode 30. A short in the dummy memory cells indicates a manufacturing defect, so a short is also likely in the memory cells 36 used for actual memory purposes within the integrated circuit 10.

Figure 4:
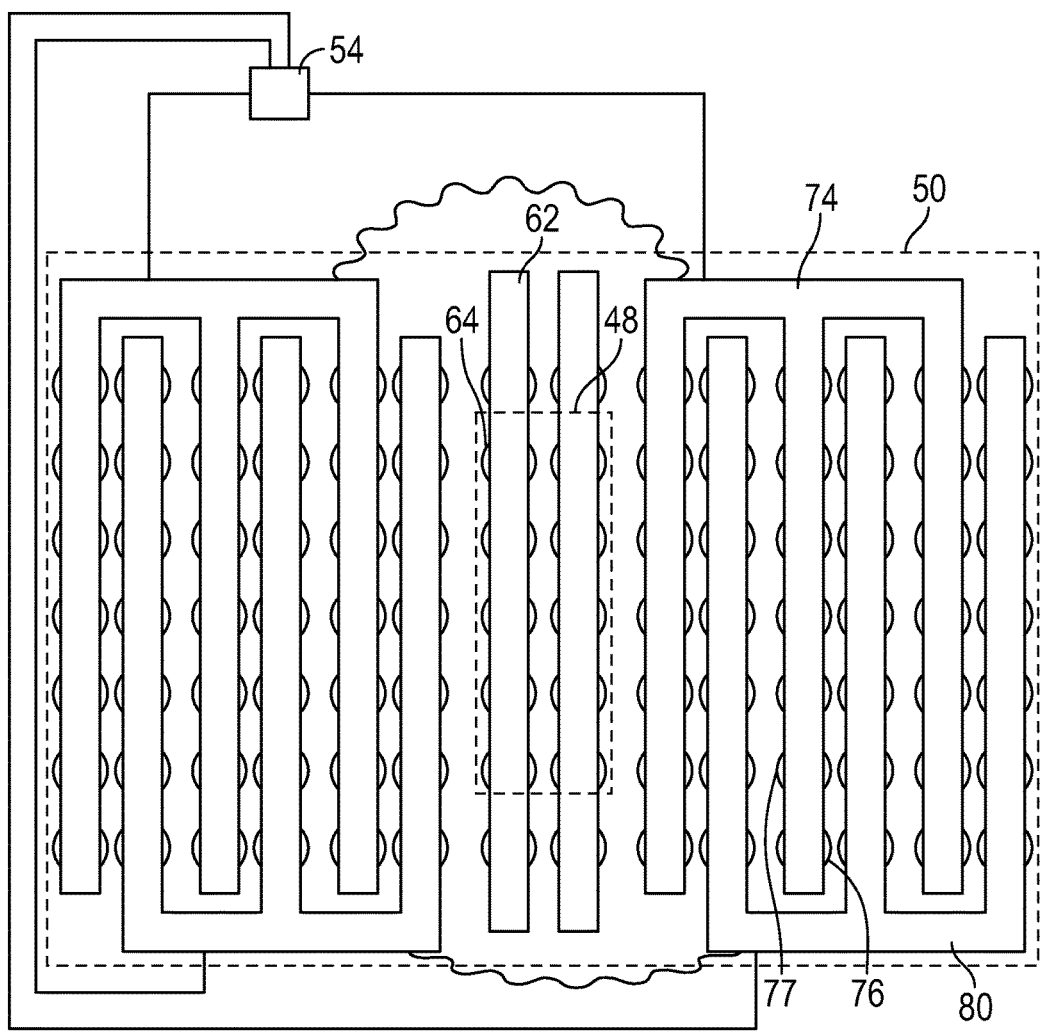

Referring to a different exemplary embodiment in FIG. 4, with continuing reference to FIGS. 1 and 2, the dummy memory bank area 50 is directly adjacent to and surrounds an active memory bank area 48 in a plane parallel with the substrate surface 18. In some embodiments, the dummy memory bank area 50 touches the active memory bank area 48, and may touch the active memory bank area 48 for an entire perimeter of the active memory bank area 48 such that the dummy memory bank area 50 completely surrounds the active memory bank area 48. A dummy memory bank area 50 adjacent to the active memory bank area 48 provides protection to the active memory bank area 48 from loading effects during manufacturing processes. As such, a dummy memory bank area 50 that completely surrounds an active memory bank area 48 provides more protection than a dummy memory bank area 50 that does not completely surround the active memory bank area 48. This protection may produce more consistent structure in the active memory cells 64, which may reduce faults or failures in the memory bank. In an exemplary embodiment, there are more than one first dummy top electrodes 74 and more than one second dummy top electrodes 80, such as on opposite sides of the active memory bank area 48. The different first dummy top electrodes 74 may be in electrical communication with each other for testing purposes, where contacts and interconnects may be used for such electrical connection, as illustrated. However, the first and second dummy top electrodes 74, 80 are electrically isolated from each other unless there is a short.

The active memory bank area 48 includes a plurality of active top electrodes 62 and active memory cells 64, and the dummy memory bank area 50 includes the first dummy top electrode 74 and a second dummy top electrode 80 adjacent to the first dummy top electrode 74. In an exemplary embodiment, the first dummy top electrode 74 is in electrical communication with the test circuit 54, and the second dummy top electrode 80 is also in electrical communication with the test circuit 54. The first and second dummy top electrodes 74, 80 are electrically isolated from each other. The test circuit 54 is configured to detect an electrical short between the first and second top electrodes 74, 80, where an electrical short indicates a manufacturing defect and short between the memory cells. A short will be indicated if the first and second dummy top electrodes 74, 80 are electrically connected. If the first and second dummy top electrodes 74, 80 are electrically isolated, then no short is detected. The electrical interrogation of the first and second dummy top electrodes 74, 80 is representative of the active memory cells 64 because the dummy memory bank area 50 is structurally similar to the active memory bank area 48, and the active and dummy memory cells 64, 76 are about the same. In an alternate embodiment, one of the first or second dummy top electrodes 74, 80 may be connected to a ground, where electrical interrogation of the other of the first or second dummy top electrodes 74, 80 indicates a short if a connection to ground is detected. Alternate test circuits 54 can also be envisioned.

Figure 5:
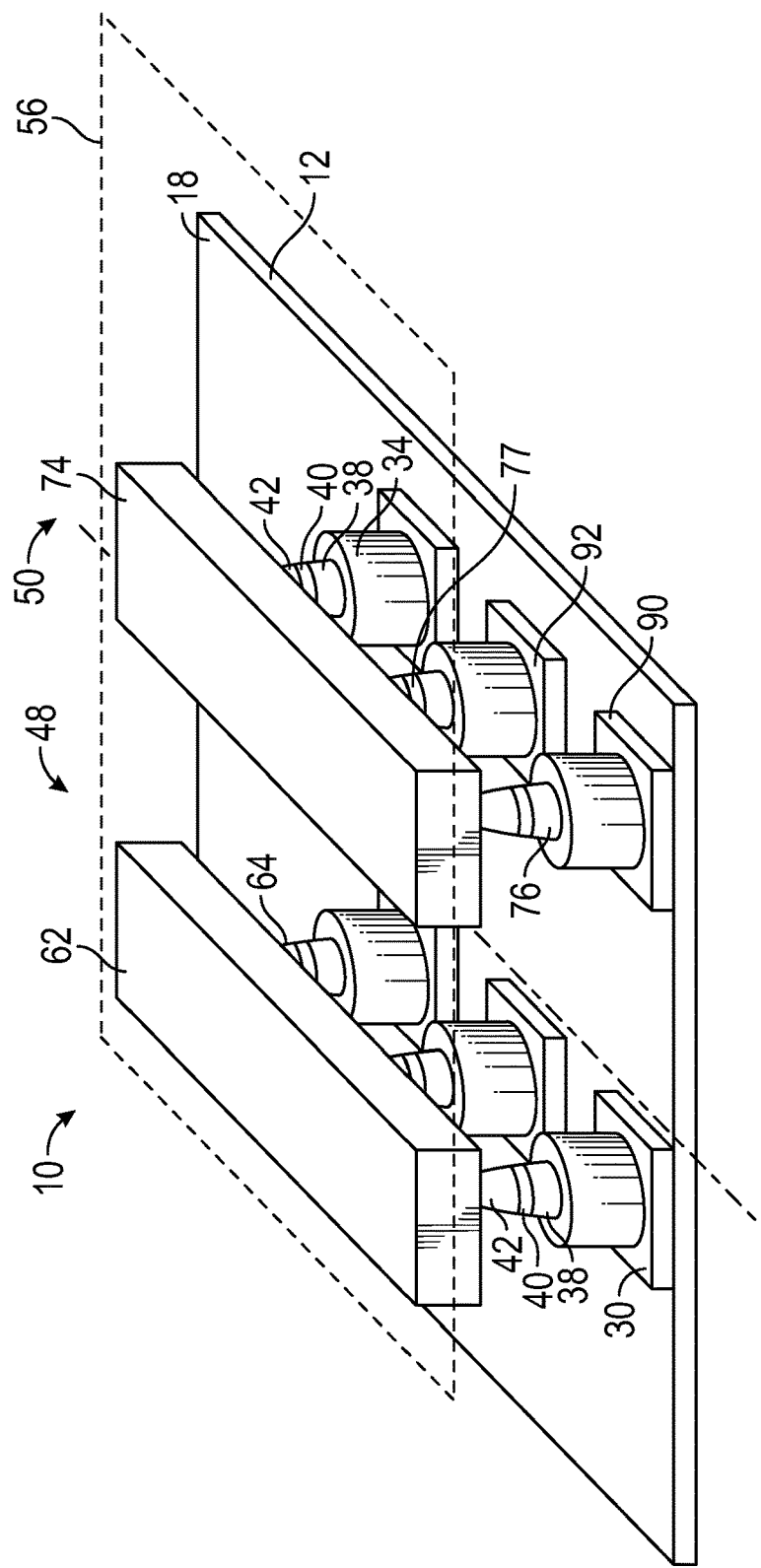
FIG. 5 is a perspective view of a portion of an integrated circuit in accordance with an exemplary embodiment, with certain layers removed to better illustrate the described components, and methods of producing the same.

FIG. 5 is a perspective view of an exemplary portion of the integrated circuit 10 that illustrates an area with a portion of the active memory bank area 48 and a portion of the dummy memory bank area 50, where interlayer dielectrics and other components are removed and wherein the substrate 12 is illustrated in close proximity without the presence of optional intervening layers to better illustrate the features of interest. Referring to FIG. 5 with continued reference to FIG. 2, the active memory bank area 48 includes an active top electrode 62 that is in electrical communication with a plurality of active memory cells 64, where the active memory cells 64 are the memory cells 36 that are positioned within the active memory bank area 48 and that are used for data storage by the integrated circuit 10. The dummy memory bank area 50 includes a first dummy top electrode 74, where the first dummy top electrode 74 is in electrical communication with the test circuit 54. A first dummy memory cell 76, a second dummy memory cell 77, and optionally additional dummy memory cells are in electrical communication with the first dummy top electrode 74. In an exemplary embodiment, the dummy and active memory cells 76, 64 are formed at the same time and in the same manner, and the active and dummy memory cells 64, 76 are in close proximity to each other, so the active and dummy memory cells 64, 76 are very similar.

The active top electrode 62 is coplanar with the first dummy top electrode 74 in an electrode plane 56 that is parallel with the substrate surface 18. In an exemplary embodiment, the active top electrode 62 is formed at the same time and in the same manner as the first dummy top electrode 74, so the active and first dummy top electrodes 62, 74 have about the same compositions and are at the same height over the substrate surface 18. As such, any over/ or under/etching, faulty deposition, or other manufacturing defect would be present in both the active and dummy top electrodes 62, 74. In a similar manner, any manufacturing defects in the active memory cell(s) 64 would be present in the first and second dummy memory cells 76, 77 because the active and dummy memory cells 64, 76, 77 were formed at the same time and in the same manner. Therefore, electrical interrogation using the first dummy top electrode 74 accurately represents the active memory cell(s) 64 and the active top electrode 74 because the active and dummy components were formed in the same manner, and at the same time.

A first dummy bottom electrode 90 underlies the first dummy memory cell 76, and the first dummy bottom electrode 90 is in electrical communication with the first dummy memory cell 76. In a similar manner, a second dummy bottom electrode 92 underlies and is in electrical communication with the second dummy electrode 77. However, the first and second dummy bottom electrodes 90, 92 are not in electrical communication with each other, so they are electrically isolated from each other. As such, the first and second dummy bottom electrodes 90, 92 do not form a continuous structure that parallels the first dummy top electrode 74.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
a dummy memory bank area;
a first dummy memory cell positioned within the dummy memory bank area, wherein the first dummy memory cell comprises a fixed layer that is magnetic, a barrier layer that is non-magnetic, and a free layer that is magnetic;
a second dummy memory cell positioned within the dummy memory bank area;
a first dummy top electrode overlying the first dummy memory cell and the second dummy memory cell, wherein the first dummy top electrode is in electrical communication with the first dummy memory cell and the first dummy top electrode is in electrical communication with the second dummy memory cell; and
a test circuit in electrical communication with the first dummy top electrode.

2. The integrated circuit of claim 1 further comprising:
a substrate comprising a substrate surface;
an active memory bank area;
an active memory cell within the active memory bank area; and
an active top electrode overlying the active memory cell, wherein the active top electrode is in electrical communication with the active memory cell, and wherein the active top electrode and the first dummy top electrode are coplanar in an electrode plane that is parallel to the substrate surface.

3. The integrated circuit of claim 2 wherein the active memory cell is electrically isolated from the test circuit.

4. The integrated circuit of claim 2 wherein the dummy memory bank area is adjacent to the active memory bank area such that the dummy memory bank area contacts the active memory bank area.

5. The integrated circuit of claim 4 wherein the dummy memory bank area surrounds the active memory bank area in a plane parallel to the substrate surface.

6. The integrated circuit of claim 2 further comprising:
a scribe area positioned at an outer edge of the integrated circuit, wherein;
the dummy memory bank area is positioned within the scribe area.

7. The integrated circuit of claim 2 wherein:
the first dummy memory cell, the second dummy memory cell, and the active memory cell each comprises the fixed layer that is magnetic, the barrier layer that is non-magnetic, and the free layer that is magnetic.

8. The integrated circuit of claim 2 further comprising:
a second dummy top electrode adjacent to the first dummy top electrode, wherein the second dummy top electrode is electrically isolated from the first dummy top electrode, the second dummy top electrode is in electrical communication with the test circuit, and the second dummy top electrode is coplanar with the first dummy top electrode.

9. The integrated circuit of claim 1 further comprising:
a second dummy top electrode, wherein the second dummy top electrode is adjacent to the first dummy top electrode, and wherein the second dummy top electrode is electrically isolated from the first dummy top electrode.

10. The integrated circuit of claim 9 wherein the second dummy top electrode is in electrical communication with the test circuit.

11. The integrated circuit of claim 1 wherein:
the test circuit comprises a test pad.

12. The integrated circuit of claim 1 further comprising:
a first dummy bottom electrode in electrical communication with the first dummy memory cell;
a second dummy bottom electrode in electrical communication with the second dummy memory cell; and
wherein the first dummy bottom electrode is electrically isolated from the second dummy bottom electrode.

13. An integrated circuit comprising:
a first dummy memory cell;
a test circuit;
a first dummy top electrode overlying the first dummy memory cell, where the first dummy top electrode is in electrical communication with the first dummy memory cell and with the test circuit;
an active memory cell;
an active top electrode overlying the active memory cell, wherein the active top electrode is in electrical communication with the active memory cell and wherein the active top electrode is electrically isolated from the test circuit; and
wherein the active memory cell and the first dummy memory cell comprise a fixed layer that is magnetic, a barrier layer that is non-magnetic, and a free layer that is magnetic.

14. The integrated circuit of claim 13 further comprising:
a substrate comprising a substrate surface;
wherein the active top electrode is coplanar with the first dummy top electrode in an electrode plane that is parallel with the substrate surface.

15. The integrated circuit of claim 14 further comprising:
a scribe area positioned at an outer edge of the integrated circuit, wherein;
the first dummy memory cell is positioned within the scribe area.

16. The integrated circuit of claim 13 further comprising:
a second dummy memory cell in electrical communication with the first dummy top electrode;
a first dummy bottom electrode underlying the first dummy memory cell, wherein the first dummy bottom electrode is in electrical communication with the first dummy memory cell;
a second dummy bottom electrode underlying the second dummy memory cell, wherein the second dummy bottom electrode is in electrical communication with the second dummy memory cell, and wherein;
the first dummy bottom electrode is electrically isolated from the second dummy bottom electrode.

17. The integrated circuit of claim 13 further comprising:
a second dummy top electrode, wherein the second dummy top electrode is adjacent to the first dummy top electrode, and wherein the second dummy top electrode is electrically isolated from the first dummy top electrode.

18. A method of producing an integrated circuit comprising:
forming a first dummy memory cell within a dummy memory bank area, wherein the first dummy memory cell comprises a fixed layer that is magnetic, a barrier layer that is non-magnetic, and a free layer that is magnetic;

forming a second dummy memory cell within the dummy memory bank area;

forming a first dummy top electrode in electrical communication with both the first dummy memory cell and the second dummy memory cell, wherein the first dummy top electrode overlies both the first dummy memory cell and the second dummy memory cell; and forming a test circuit in electrical communication with the first dummy top electrode.

\* \* \* \* \*